United States Patent [19]
Sheng

[11] Patent Number: 5,258,365
[45] Date of Patent: Nov. 2, 1993

[54] CRTLSRCACUO AND RELATED SUPERCONDUCTING SYSTEMS

[75] Inventor: Zhengzhi Sheng, Fayetteville, Ark.

[73] Assignee: The University of Arkansas, Little Rock, Ark.

[21] Appl. No.: 823,853

[22] Filed: Jan. 22, 1992

[51] Int. Cl.$^5$ .................. C01F 11/02; C01G 3/02; C01G 15/00; H01L 39/12

[52] U.S. Cl. .................. 505/1; 252/518; 252/521; 505/783

[58] Field of Search .................. 505/1, 783, 785; 252/518, 521

[56] References Cited

FOREIGN PATENT DOCUMENTS 2244268 11/1991 United Kingdom .

OTHER PUBLICATIONS

Sheng "A new 1212-type phase: Cr-substituted $TlSr_2CaCu_2O_7$ . . . "*Modern Phys. Lett.* B v. 5(9) Apr. 20, 1991, pp. 635-642.

Li "Superconductivity at 70 K and 100 K in the MoTl-SrCa-CuO . . . " *Modern Physics Letters* B, vol. 5 (No. 24 & 25) Oct. 1991, pp. 1661-1667.

*Primary Examiner*—Paul Lieberman
*Assistant Examiner*—John Boyd
*Attorney, Agent, or Firm*—Hermann Ivester

[57] ABSTRACT

The present invention provides a high temperature superconductor system comprising XTlSrCaCuO wherein X is chosen from the group consisting of Cr, Mo, and W. In a preferred embodiment, the superconductor comprises CrTlSrCaCuO. Methods of making the superconductor system are also provided.

14 Claims, 3 Drawing Sheets

CRTLSRCACUO AND RELATED SUPERCONDUCTING SYSTEMS

The present invention relates generally to superconductors. More specifically, the present invention relates to a thallium based superconducting system.

A number of superconducting systems are known. These systems include the discovery of the 90 K Tl—Ba—Cu—O system and the 120 K Tl—Ba—Ca—Cu—O system. These systems have led not only to the identification of a number of Tl-containing superconducting compounds, including $Tl_mBa_2Ca_{n-1}Cu_nO_{1.5m+2n+1}$, wherein m is equal to 1-2 and n is equal to 1-5, but also the discovery of a series of Sr—Ca—Cu—O based superconducting systems. In this regard, for example, the following systems have been proposed: the 70 K Tl—Sr—Ca—Cu—O system; the 115 K Pb—Tl—Sr—Ca—Cu—O system; the 90 K R—Tl—Sr—Ca—Cu—O system, wherein R is a rare earth; and the 70 K Pb—R—Sr—Ca—Cu—O system.

In the TlBaCaCuO superconducting system, two series of superconducting compounds, $Tl_2Ba_2Ca_{n-1}Cu_nO_{2n+4}$ with double TlO layers and $TlBa_2Ca_{n-1}Cu_nO_{2+3}$ with a single Tl layer, have been identified. See, Hazen et. al., *Physical Review Letters* 60 (1987) 1657 and Parkin et. al., *Physical Review Letters* 61 (1988) 750. The single TlO layer wherein n equals 2, $TlBa_2CaCu_2O_7$, is typically referred to as the 1212 type phase.

With respect to the TlSrCaCuO system, this system was found to have superconducting temperatures of 20 K and 70 K. There is also, in the TlSrCaCuO system, a 1212 phase, $TlSr_2CaCu_2O_7$. Although, it has been reported that the $TlSr_2CaCu_2O_7$ system is superconducting at 70 to 80 K (see Maysuda et. al., *J.J.A.P.* 27 (1988) 2062 and Martin et. al., *Physica* C157 (1989) 460) it is difficult to synthesize a pure sample. Additionally, at times, it is not superconducting. See, Subramanian et. al., *Science* 242 (1988) 249 and Doi et. al., *J.J.A.P.* 29 (1990) L57.

When Tl is partially substituted by Pb, (Tl, Pb)$Sr_2CaCu_2O_7$ is formed and is superconducting at 75 K. Subramanian et. al., *Science* 242 (1988) 249. When a rare earth (R) is introduced into the system, $TlSr_2(Ca, R)Cu_2O_7$ can be formed and is superconducting around 90 K. Sheng et. al., *Physical Rev. B*, 39 (1989) 2918 and Liang et. al., *Solid State Communication* 70 (1989) 661.

There is also a 1212 phase in the bismuth substituted (Tl, Bi)$Sr_2CaCu_2O_7$ system, that is superconducting at 75 to 95 K. See, Haldar et. al., *Journal of Superconductivity* 1 (1988) 211 and Li et. al., *Physica* C157 (1989) 465.

A combination substitution Pb or Bi for Tl and R for produced (Tl, Pb)$Sr_2$(Ca, R)$Cu_2O_7$ and Tl, Bi)$Sr_2$(Ca, R)$Cu_2O_7$ with a Tc of above 100 K. See, Liu et. al., *Physica* C162-164 (1989) 869 and Huang et. al., *Physica* C162-164 (1989) 39.

A Ca-free 90 K $TlSr_2$(Sr, R)$Cu_2O_7$ and 105 K (Tl, Pb)$Sr_2$(Sr, R)$Cu_2O_7$) have also been reported. See, Ganguli, *Application Physica Letter* 55 (1989) 2664; Sheng et. al., *Modern Physica Letter* B4 (1990) 967; Sheng et. al., *Physica* C172 (1990) 43; and Sheng et. al., *Modern Physica Letters* B4 (1990) 1281.

A new superconducting system, and processes for making same, would be desirable for many reasons including providing higher Tc's and improved methods for making commercially viable superconductors.

SUMMARY OF THE INVENTION

The present invention provides a new high temperature superconductor comprising XTlSrCaCuO wherein X is chosen from the group consisting of Cr, Mo, and W. In a preferred embodiment, this superconducting system comprises CrTlSrCaCuO.

Pursuant to the present invention, in the Cr-substituted $TlSr_2CaCu_2O_7$ system, Tc's of up to 110 K have been observed. The system is easily prepared and has very good quality suitable for practical and commercial applications.

In an embodiment, a high temperature superconductor is provided having the nominal composition $X_aTl_bSr_cCa_dCu_eO_f$ wherein: X is chosen from the group consisting of Cr, Mo, and W;

$0 < a \leq 1.0$;

$0.5 \leq b \leq 2.0$;

$1.5 \leq c \leq 2.5$;

$0 \leq d \leq 2.0$;

$1.0 \leq e \leq 3.0$; and $3.25 \leq f \leq 11.5$.

A method for producing the superconductor of the present invention is also provided. To this end, the CrTlSrCaCuO samples can be prepared using high-purity chemicals $Cr_2O_3$ (or $CrO_3$, or $(NH_4)_2Cr_2O_7$ (or $Tl_2CO_3$), SrO (or $SrCO_3$), CaO (or $CaCO_3$, and CuO. In a typical procedure, appropriate amounts of $SrCO_3$, $CaCO_3$, CuO, and $Cr_2O_3$ are completely ground and mixed, and heated at approximately 900° to about 950° C. in air for about 24 hours with several intermediate grindings to obtain uniform powders. Appropriate amounts of the powders and $Tl_2O_3$ are completely mixed and ground, and pressed into pellets with a diameter of 7 mm and a thickness of approximately 2 to about 3 mm. The pellets are placed in a covered alumina crucible. The crucible with the contents is introduced into a preheated tube furnace, and heated at approximately 1000° to about 1050° C. in flowing oxygen for approximately 5 to about 15 minutes. The temperature of the furnace is then decreased gradually to about 850° C., and held for approximately 8 to about 24 hours. Finally, the temperature of the furnace is decreased to below 200° C.

If Mo or W is used, the starting materials can include $MoO_3$, $WO_3$, $Tl_2O_3$, (or $Tl_2CO_3$), SrO (or $SrCO_3$), CaO (or $CaCO_3$), and CuO.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
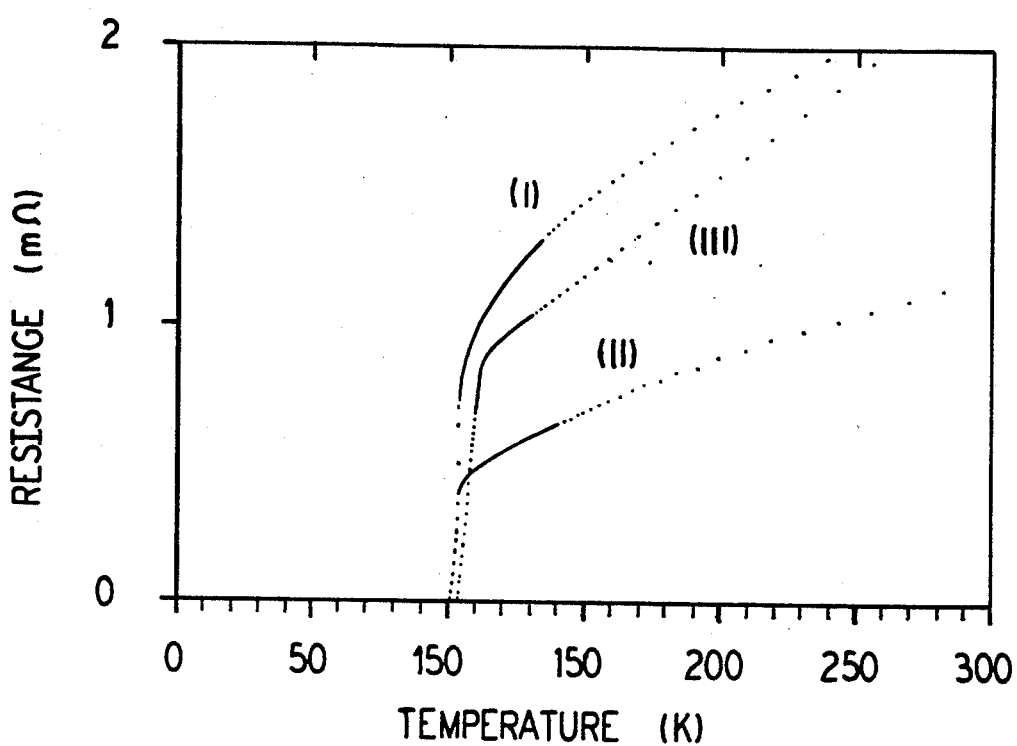
FIG. 1 illustrates resistance-temperature cuves for three samples having a nominal composition of: $Cr_{0.5}Tl_{0.5}Sr_2CaCu_2O_x$ (I); $Cr_{0.3}TlSr_2Ca_{0.7}Cu_2O_x$ (II); and $Cr_{0.5}TlSr_2CaCu_{1.5}O_x$ (III).

The present invention provides a new superconducting system and methods for making same. The system comprises the composition XTlSrCaCuO wherein X is chosen from the group consisting of Cr, Mo, and W. In a preferred embodiment, a high temperature superconductor is provided having the composition CrTlSrCaCuO.

In an embodiment, a high temperature superconductor is provided having a nominal composition $X_aTl_bSr_cCa_dCu_eO_f$ wherein:

X is chosen from the group consisting of Cr, Mo, and W;

$0 < a \leq 1.0$;

$0.5 \leq b \leq 2.0$;

$1.5 \leq c \leq 2.5$;

$0 \leq d \leq 2.0$;

$1.0 \leq e \leq 3.0$;

$3.25 \leq f \leq 11.5$.

Pursuant to the present invention, Sr can be partially or fully substituted by Ba, La, or K, Ca can be substituted by a rare earth, and Tl by Pb, Bi, Hg, and In.

Pursuant to the present invention, in an embodiment, a Cr substituted $TlSr_2CaCu_2O_7$ 1212 type phase is provided with a Tc of up to 110 K. The Applicant believes this is the first time that a single element substitution for the $TlSr_2CaCu_2O_7$ system has enhanced Tc of the 1212 phase to above 100 K. Likewise, Mo and W can be used instead of Cr.

Referring to FIG. 1, samples prepared pursuant to the present invention, were created having nominal compositions as follows: $Cr_{0.5}Tl_{0.5}Sr_2CaCu_2O_x$ (I); $Cr_{0.3}TlSr_2Ca_{0.7}Cu_2O_x$ (II); and $Cr_{0.5}TlSr_2CaCu_{1.5}O_x$ (III).

As illustrated in FIG. 1, all three samples demonstrated a metallic behavior at normal state. The onset temperature and zero resistance temperatures are 110 K and 102 K for $Cr_{0.5}Tl_{0.5}Sr_2CaCu_2O_x$; 107 and 101 K for $Cr_{0.3}TlSr_2Ca_{0.7}Cu_2O_x$; and 112 K and 103 K for $Cr_{0.5}TlSr_2CaCu_{1.5}O_x$.

Figure 2:
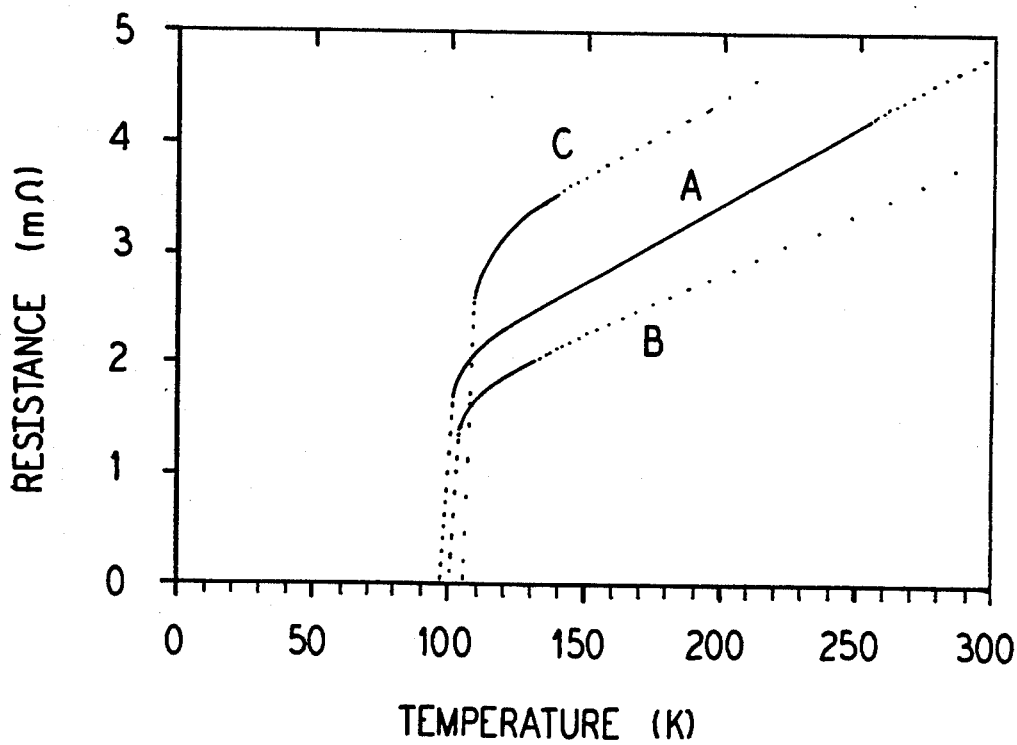
FIG. 2 illustrates superconducting behavior of three samples A, B, and C, which have the same nominal composition, $Cr_{0.25}TlSr_2CaCu_{1.75}O_x$, and were prepared under different conditions.

The Applicant has found that the superconducting behavior of a CrTlSrCaCuO sample depends on the preparation conditions. Referring now to FIG. 2, three samples A, B, and C are illustrated having the same nominal composition, $Cr_{0.25}TlSr_2CaCu_{1.75}O_x$, and were prepared under different conditions.

Sample A was prepared using high-purity amounts of $SrCO_3$, $CaCO_3$, CuO, and $Cr_2O_3$ that were completely mixed and ground, and heated at 900°–950° C. in air for about 24 hours with several intermediate grindings to obtain uniform powders. Appropriate amounts of the powders and $Tl_2O_3$ were completely mixed and ground, and pressed into pellets with a diameter of 7 mm and a thickness of about 2–3 mm. The pellets were placed in a covered alumina crucible. The crucible with the contents was introduced into a preheated tube furnace, and heated at 1000° in flowing oxygen for 5 minutes followed by air cooling.

Sample B was prepared using appropriate amounts of $SrCO_3$, $CaCO_3$, CuO, and $Cr_2O_3$ that were completely ground and mixed, and heated at 900°–950° C. in air for about 24 hours with several intermediate grindings to obtain uniform powders. Appropriate amounts of the powders and $Tl_2O_3$ were completely mixed and ground, and pressed into pellets with a diameter of 7 mm and a thickness of about 2–3 mm. The pellets were placed in a covered alumina crucible. The crucible with the contents was introduced into a preheated tube furnace, and heated at 1000°–1050° C. in flowing oxygen for about 5–15 minutes. The temperature of the furnace was then decreased gradually to approximately 850° C., and held for 8–24 hours. Finally, the temperature of the furnace decreased to below 200° C.

Sample C was prepared using appropriate amounts of $SrCO_3$, $CaCO_3$, CuO, and $Cr_2O_3$ were completely mixed and ground, and heated at 900°–950° C. in air for about 24 hours with several intermediate grinds to obtain uniform powders. Appropriate amounts of the powders and $Tl_2O_3$ were completely mixed and ground, and pressed into pellets with a diameter of 7 mm and a thickness of about 2–3 mm. The pellets were placed in a covered alumina crucible. The crucible with the contents was introduced into a preheated tube furnace and heated at approximately 1000°–1050° C. in flowing oxygen for about 5–15 minutes. The temperature of the furnace was then decreased gradually to 850° C., and held for 8–24 hours. Finally, the temperature of the furnace was decreased to below 200° C. The sample was then subjected to an additional annealing step at approximately 750° C. in helium for about 1 hour.

The onset temperatures of Samples A, B, and C were 104, 106, and 112 K, respectively. The zero resistance temperatures were as follows 96, 101, and 106 K, respectively. Experiments have demonstrated that an increased annealing time in an oxygen atmosphere can significantly improve the quality of the samples and a proper annealing in a non-oxygen atmosphere is necessary for the best superconducting behavior of the samples.

Not only does the superconducting system of the present invention provide easy methods for the preparation of superconductors, but such systems also have a very good quality. Most of the samples exhibit a sharp superconducting transition in resistance, Ac susceptibility, and thermopower. Further, the samples demonstrate a strong diamagnetic signal.

Figure 3A:
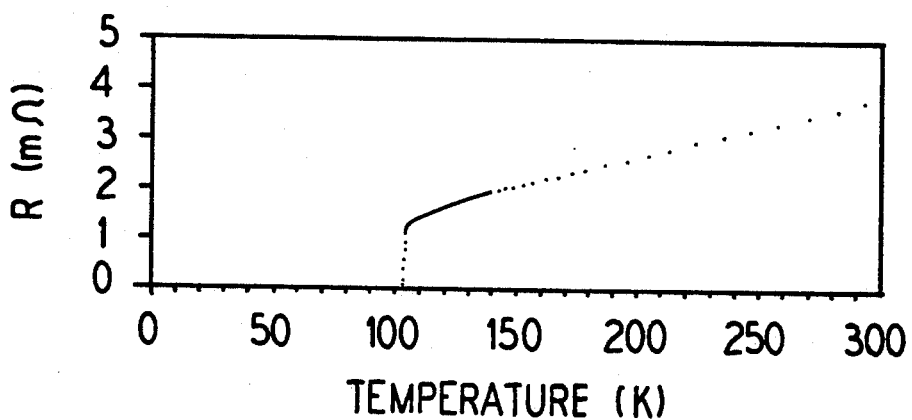
FIG. 3 illustrates temperature-dependence of resistance, Ac susceptibility, and thermopower for a nominal $Cr_{0.5}TlSr_2CaCu_{1.5}O_x$ sample
Figure 3B:
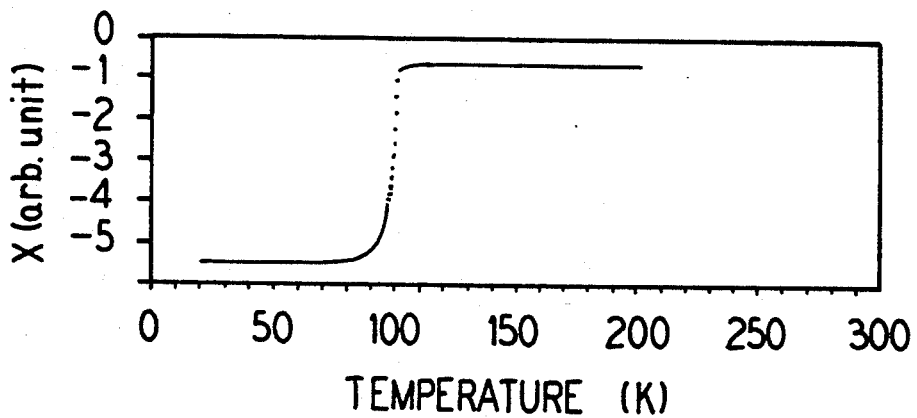
Figure 3C:
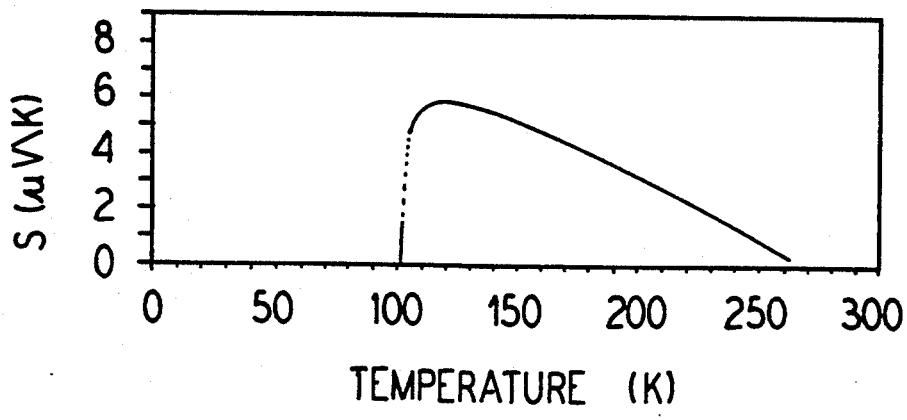

Referring now to FIG. 3, illustrated is temperature dependencies of resistance, Ac susceptibility, and thermopower for a nominal $Cr_{0.5}TlSr_2CaCu_{1.5}O_x$ sample. The resistance curve illustrates an onset temperature of 107 K and a zero resistance temperature of 103 K. The Ac susceptibility shows an onset temperature of about 103 K which is fairly consistent with that by resistance measurements. The diamagnetic transition is very sharp and reaches saturation at above 90 K. The saturated diamagnetic signal for the sample is comparable to those of any other superconductors with good quality, this indicating a large volume of superconducting material.

Thermopower $S(\mu v/k)$ of the sample increases with decreasing temperature, and reaches a maximum value of about 6 $\mu v/k$ at about 115 K, and then drops sharply to zero at about 102 K. This behavior is generally similar to those of p-type YBaCuO, BiSrCaCuO, and TlBaCaCuO superconductors. However, S(μv/k) is negative at room temperature. This indicates either the excellent quality of CrTlSrCaCuO superconductors or suggests an intrinsic property different from other superconductors.

Powder x-ray diffraction analyses, with Cu Kα radiation, for a number of CrTlSrCaCuO samples demonstrates that a 1212-type phase, Cr-substituted $TlSr_2CaCu_2O_7$, is responsible for the observed 110 K superconductivity.

Figure 4:
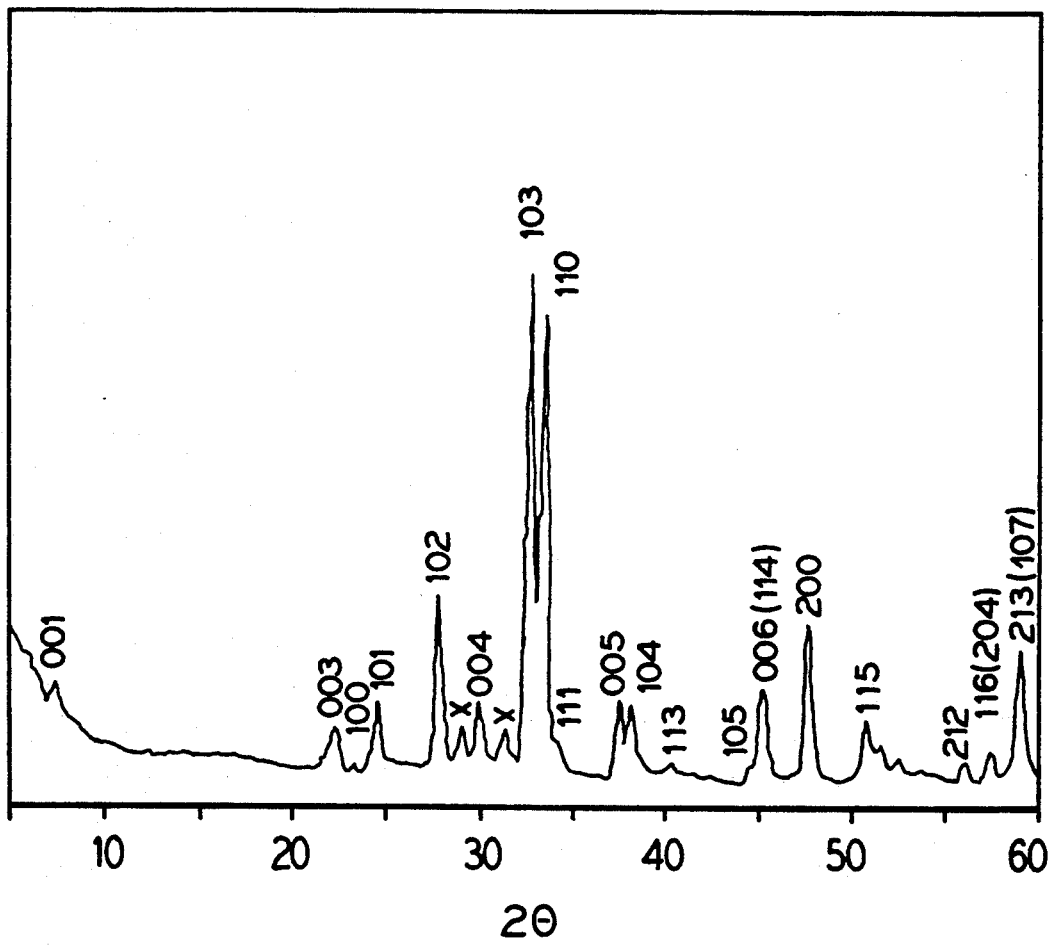
FIG. 4 illustrates the x-ray diffraction pattern for a nominal $Cr_{0.25}TlSr_2CaCu_{1.75}O_x$ sample.

Referring now to FIG. 4, the x-ray diffraction pattern for a nominal $Cr_{0.25}TlSr_2CaCu_{1.75}O_x$ sample is illustrated. The diffraction peaks, except two small peaks at 2θ of about 28.8° and 31.3°, can be well indexed based on a tetragonal unit cell (space group P4/mmm) with $a = 2.813$ Å and $c = 12.026$ Å. The indexed diffraction data is listed in Table I.

TABLE I

Diffraction data for the 1212 phase in a nominal $Cr_{0.25}TlSr_2CaCu_{1.75}O_x$ sample.

| h | k | l | $d_{Obs}$ (Å) | $d_{cal}$ (Å) | Int. |
|---|---|---|---|---|---|
| 0 | 0 | 1 | 12.0634 | 12.0257 | 7 |
| 0 | 0 | 3 | 4.0172 | 4.0086 | 11 |
| 1 | 0 | 0 | 3.8132 | 3.8133 | 3 |
| 1 | 0 | 1 | 3.6293 | 3.6349 | 16 |
| 1 | 0 | 2 | 3.2173 | 3.2203 | 37 |
| 0 | 0 | 4 | 3.0052 | 3.0064 | 12 |
| 1 | 0 | 3 | 2.7610 | 2.7629 | 100 |
| 1 | 1 | 0 | 2.6963 | 2.6964 | 90 |
| 1 | 1 | 1 | 2.6347 | 2.6310 | 4 |
| 0 | 0 | 5 | 2.4028 | 2.4051 | 16 |
| 1 | 0 | 4 | 2.3603 | 2.3609 | 16 |
| 1 | 1 | 3 | 2.2391 | 2.2373 | 4 |
| 1 | 0 | 5 | 2.0348 | 2.0343 | 2 |
| 1 | 1 | 4 | 2.0091 | 2.0073 | (23) |
| 0 | 0 | 6 | 2.0049 | 2.0043 | (23) |
| 2 | 0 | 0 | 1.9056 | 1.9066 | 35 |
| 1 | 1 | 5 | 1.7964 | 1.7949 | 14 |
| 2 | 1 | 2 | 1.6414 | 1.6406 | 6 |
| 2 | 0 | 4 | 1.6098 | 1.6101 | (6) |
| 1 | 1 | 6 | 1.6085 | 1.6086 | (6) |
| 2 | 1 | 3 | 1.5686 | 1.5692 | (28) |
| 1 | 0 | 7 | 1.5661 | 1.5663 | (28) |

Powder x-ray diffraction analyses for some serial samples, including $Cr_yTl_{1-y}Sr_2CaCu_2O_x$, $Cr_yTlSr_2Ca_{1-y}Cu_2O_x$, and $Cr_yTlSr_2CaCu_{2-y}O_x$, illustrates a notable common feature: with an increase of the Cr content in the samples, the a-axis of the 1212 phase increase and c-axis decreases. Table II lists a-axis and c-axis for the 1212 phase in serial sample of $Cr_yTlSr_2CaCu_{2-y}O_x$ as an example.

TABLE II

Lattice parameters a and c of the 1212 phase in the nominal samples $Cr_yTlSr_2CaCu_{2-y}O_x$.

| y | a (Å) | c (Å) |
|---|---|---|
| 0.0 | 3.783 | 12.12 |
| 0.1 | 3.804 | 12.06 |
| 0.2 | 3.809 | 12.06 |
| 0.3 | 3.811 | 12.00 |
| 0.4 | 3.819 | 12.01 |
| 0.5 | 3.817 | 12.02 |
| 0.6 | 3.819 | 12.01 |
| 1.0 | 3.814 | 12.00 |

With respect to its chemical properties, Cr in the Cr-substituted $TlSr_2CaCu_2O_7$ is most probably at the 3+ valence state. This is also supported by experimental results that rather pure 1212 phase samples could be synthesized with $Cr_2O_3$, $Tl_2O_3$, SrO, CaO, and CuO in a sealed container.

The location of Cr in the 1212 structure was determined on samples with nominal compositions $Cr_{0.25}TlSr_2CaCu_{1.75}I_x$ and $Cr_{0.5}TlSr_2CaCu_{1.5}O_x$. These specimens were examined by electron microanalysis and structures were determined by Reitveld analysis of powder x-ray diffraction data. The former sample yields a 1212 superconductor with unit cell dimensions $a = 3.8159$ (2) Å and $c = 12.0111$ (9) Å, and an approximate composition $Tl_{1.00}Sr_{2.00}(Ca_{0.83}Cr_{0.17})Cu_{2.00}O_x$. This sample also contains a small amount of a second unidentified Ca-rich phase. The second sample yields a 1212 superconductor with similar unit cell dimensions $a = 3.8176$ (6) Å $= c = 12.0312$ (25) Å, and an approximate composition $(Tl_{0.97}Cr_{0.03})Sr_{2.00}(Ca_{0.86}Cr_{0.14})Cu_{2.00}O_x$.

There is no evidence for Cr substitution in Cu sites. This result explains why $Cr^{3+}$-substitution increases the a-axis and decreases the c-axis of the 1212 phase. On one hand, the substitution of smaller $Cr^{3+}$ for larger "spacer" ion $Ca^{2+}$ results in the decrease of the c-axis. On the other hand, according to the concept of "average Cu valence", stoichiometric $TlSr_2CaCu_2O_7$ has an average Cu valence of 2.5+, or is overdoped by holes; substitution of higher valence $Cr^{3+}$ for lower valence $Ca^{2+}$ would decrease the average valence of Cu, and thus expand the a-axis of the 1212 phase (and stabilize the 1212 phase). A similar effect of rare earths on lattice parameters a and c has been reported for $TlBa_2(Ca,R)Cu_2O_7$.

The existing data illustrates that substitution of $R^{3+}$ for $Ca^{2+}$ in $TlSr_2CaCu_2O_7$ can only reach a Tc of about 90 K, and that double substitutions, Pb (or Bi) for Tl, and R for Ca, are necessary for the 1212 phase to exhibit superconductivity above 100 K.

The single substitution of $Cr^{3+}$ and $Ca^{2+}$ does increase Tc of the 1212 phase to above 100 K. This may suggest a special capability of $Cr^{3+}$ in enhancing Tc of the 1212 phase. However, it is also possible that the single element of Cr plays a role of double substitutions: $Cr^{3+}$ substitutes for both $Tl^{3+}$ and $Ca^{2+}$, resulting in enhancement of Tc. Furthermore, substitution of trace Cr for Cu cannot be ruled out. The CuO plane is believed to be responsible for high Tc superconductivity, and replacement of Cu is most sensitive to superconductivity. A trace amount of Cr going to the Cu site may enhance Tc to above 100 K.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A high temperature superconductor comprising:

XTlSrCaCuO wherein

X is chosen from the group consisting of Cr, Mo, and W.

2. The high temperature superconductor of claim 1 wherein X is Cr.

3. The high temperature superconductor of claim 1 wherein X is Mo.

4. The high temperature superconductor of claim 1 wherein X is W.

5. A high temperature superconductor having the nominal composition:

$X_aTl_bSr_cCa_dCu_eO_f$ wherein:
X is chosen from the group consisting of Cr, Mo, and W;

$0 < 1 \leq 1.0$;

$0.5 \leq b \leq 2.0$;

$1.5 \leq c \leq 2.5$;

$0 \leq d \leq 2.0$;

$1.0 \leq e \leq 3.0$; and $3.25 \leq f \leq 11.5$.

6. The high temperature superconductor of claim 5 wherein X is Cr.
7. The high temperature superconductor of claim 5 wherein X is Mo.
8. The high temperature superconductor of claim 5 wherein X is W.
9. A high temperature superconductor having the nominal composition:

$Cr_{0.25}TlSr_2CaCu_{1.75}O_{6.625}$.

10. A high temperature superconductor having the nominal composition:

$Cr_{0.5}Tl_aSr_2CaCu_bO_x$, $0.5 \leq a \leq 1$;

$1.5 \leq b \leq 2$; and $x = 3.75 + a + b$.

11. A high temperature superconductor having the nominal composition:

$Cr_{0.3}TlSr_2Ca_{0.7}Cu_2O_{6.65}$.

12. A high temperature superconducting phase having the approximate composition:

$TlSr_2(Ca_{0.83}Cr_{0.17})Cu_2O_{7-z}$ wherein:

$z \leq 0.5$ and a unit cell having the dimensions:
a = 3.8159 Å and c = 12.0111 Å.

13. A high temperature superconductor phase having the approximate composition:

$(Tl_{0.97}Cr_{0.03})Sr_2(Ca_{0.86}Cr_{0.14})Cu_2O_{7-z}$ wherein:

$z \leq 0.5$ and a unit cell having the dimensions:
a = 3.1876 Å and c = 12.0312 Å.

14. A high temperature superconductor having the nominal composition:

$Cr_yTlSr_2CaCu_{2-y}O_{6.5+0.5y}$, and the lattice parameters of 1+c of the 1212 phase are as follows:

| y | a (Å) | c (Å) |
| --- | --- | --- |
| 0.0 | 3.783 | 12.12 |
| 0.1 | 3.804 | 12.06 |
| 0.2 | 3.809 | 12.06 |
| 0.3 | 3.811 | 12.00 |
| 0.4 | 3.819 | 12.01 |
| 0.5 | 3.817 | 12.02 |
| 0.6 | 3.819 | 12.01 |
| 1.0 | 3.814 | 12.00 |

* * * * *